United States Patent
Chuang

(10) Patent No.: US 10,498,324 B2
(45) Date of Patent: Dec. 3, 2019

(54) WAVEFORM CONVERSION CIRCUIT FOR GATE DRIVER

(71) Applicant: Delta Electronics, Inc., Taoyuan (TW)

(72) Inventor: Po-Chin Chuang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/422,820

(22) Filed: May 24, 2019

(65) Prior Publication Data

US 2019/0280685 A1   Sep. 12, 2019

Related U.S. Application Data

(62) Division of application No. 15/203,468, filed on Jul. 6, 2016, now Pat. No. 10,348,286.

(51) Int. Cl.
| | |
|---|---|
| *H03K 17/687* | (2006.01) |
| *H03K 17/041* | (2006.01) |
| *H03K 5/08* | (2006.01) |
| *H01L 29/16* | (2006.01) |
| *H01L 29/20* | (2006.01) |
| *H03K 17/0412* | (2006.01) |

(52) U.S. Cl.
CPC .......... *H03K 17/041* (2013.01); *H01L 29/16* (2013.01); *H01L 29/2003* (2013.01); *H03K 5/08* (2013.01); *H03K 17/0412* (2013.01); *H03K 17/687* (2013.01)

(58) Field of Classification Search
CPC ............. H03K 17/041; H03K 17/0412; H03K 17/687; H01L 29/16; H01L 29/2003
USPC ............ 327/108–112, 170, 172–177; 326/29
See application file for complete search history.

(56) References Cited

U.S. PATENT DOCUMENTS

| | | | |
|---|---|---|---|
| 4,949,213 A | 8/1990 | Sasagawa et al. | |
| 5,602,724 A | 2/1997 | Balakrishnan | |
| 7,019,551 B1* | 3/2006 | Biesterfeldt | ......... H03K 17/163 |
| | | | 326/27 |
| 9,136,833 B2 | 9/2015 | Hayasaka | |
| 2005/0024103 A1 | 2/2005 | Nascimento | |
| 2008/0030229 A1 | 2/2008 | Walker | |

(Continued)

FOREIGN PATENT DOCUMENTS

JP       S55134539 A    10/1980

OTHER PUBLICATIONS

Office Action dated Feb. 9, 2018 in TW Application No. 106115954 (18 pages).

*Primary Examiner* — Tomi Skibinski

(74) *Attorney, Agent, or Firm* — Muncy, Geissler, Olds & Lowe, P.C.

(57) ABSTRACT

A waveform conversion circuit for turning a switch device on and off by applying a control signal from a controller to a gate terminal of the switch device is provided. The switch device has the gate terminal, a drain terminal, and a source terminal. The waveform conversion circuit includes a parallel circuit of a first capacitor and a first resistor and a voltage clamp unit. The parallel circuit is coupled between the controller and the gate terminal. The voltage clamp unit is coupled between the gate terminal and the source terminal and configured to clamp a voltage across the gate terminal to the source terminal at a first voltage in an OFF pulse of the control signal and at a second voltage in an ON pulse of the control signal.

20 Claims, 14 Drawing Sheets

(56) References Cited

U.S. PATENT DOCUMENTS

2012/0306545 A1 12/2012 Machida et al.
2016/0261266 A1 9/2016 Kampl et al.

* cited by examiner

WAVEFORM CONVERSION CIRCUIT FOR GATE DRIVER

CROSS REFERENCE TO RELATED APPLICATIONS

The present application is a divisional of U.S. patent application Ser. No. 15/203,468, filed Aug. 2, 2016, the content of which is hereby incorporated by reference in its entirety.

BACKGROUND OF THE INVENTION

Field of the Invention

The disclosure relates generally to a gate driver for driving the gate of a switching element.

Description of the Related Art

A GaN device has great potential compared with an existing Si device, and therefore, is anticipated for practical use. A standard GaN FET is a normally-on device, and therefore, needs a negative power source. On the other hand, a normally-off GaN FET is very difficult to produce. The normally-off GaN FET has a threshold voltage of about +1 V, which is very low compared to that of an existing Si MOSFET. This is the first problem with the normally-off GaN FET.

In addition, the normally-off GaN FET can break easily if a large voltage is applied to its gate, such that the normally-off GaN FET is unable to be applied in a normal driving IC. This is the second problem with the normally-off GaN FET. Due to these two problems, a gate driver for the Si MOSFET (IGBT, or Insulated Gate Bipolar Transistor) is not applicable as it is to the normally-off GaN FET. Namely, the normally-off GaN FET needs an exclusive gate driver.

In connection with the first problem, the turn-off time of the normally-off GaN FET will be shortened if a voltage that is sufficiently lower than the threshold voltage of about +1 V, and preferably a negative voltage lower than 0 V, is applied to the gate of the normally-off GaN FET. For this, the normally-off GaN FET needs a negative power source. A negative power source is undesirable, however, although it is necessary for realizing a normally-off state.

In connection with the second problem, the turn-on tune of the normally-off GaN FET can be shortened if a voltage that is sufficiently higher than the threshold voltage is applied to the gate of the normally-off GaN FET. More precisely, shortening the turn-on time requires an instantaneous large current, and creating such a large current is properly achievable with a higher voltage. It is, however, unable to apply a high voltage such as 10V used for the Si MOSFET to the gate of the normally-off GaN FET because this breaks the normally-off GaN FET.

Therefore, a waveform conversion circuit is urgently needed in order to convert the gate drive voltage used for the Si MOSFET to one for the normally-off GaN FET without reducing the switching speed, and this waveform conversion can be adopted for use with any type of transistor.

BRIEF SUMMARY OF THE INVENTION

For solving problems described above, the invention provides a waveform conversion circuit for converting the gate drive voltage used for the Si MOSFET to that for the normally-off GaN FET without reducing the switching speed and supplying a negative voltage to turn off the normally off GaN FET.

In an embodiment, a waveform conversion circuit for turning a switch device on and off by applying a control signal from a controller to a gate terminal of the switch device is provided. The switch device has the gate terminal, a drain terminal, and a source terminal. The waveform conversion circuit comprises a parallel circuit of a first capacitor and a first resistor and a voltage clamp unit. The parallel circuit is coupled between the controller and the gate terminal of the switch device. The voltage clamp unit is coupled between the gate terminal and the source terminal of the switch device and configured to clamp a voltage across the gate terminal to the source terminal.

According to an embodiment of the invention, the control signal ranges from a high voltage level to a low voltage level, a first voltage is converted from the low voltage level of the control signal, and a second voltage is converted from the high voltage level of the control signal.

According to an embodiment of the invention, the control signal ranges from a high voltage level to a low voltage level. The waveform conversion circuit converts the control signal to a driving signal ranging from the second voltage to the first voltage.

According to an embodiment of the invention, the first voltage is not greater than the low voltage level.

According to an embodiment of the invention, the second voltage is not greater than the high voltage level.

According to an embodiment of the invention, the voltage clamp unit comprises a zener diode. The zener diode comprises an anode and a cathode. The anode is coupled to the source terminal of the switch device, and the cathode is coupled to the gate terminal of the switch device, in which the first voltage is determined by the forward voltage of the zener diode, and the second voltage is determined by the reverse breakdown voltage of the zener diode.

According to another embodiment of the invention, the voltage clamp unit comprises a zener diode. The zener diode comprises an anode and a cathode. The anode is coupled to the gate terminal of the switch device, and the cathode is coupled to the source terminal of the switch device, in which the first voltage is determined by the reverse breakdown voltage of the zener diode, and the second voltage is determined by the forward voltage of the zener diode.

According to another embodiment of the invention, the voltage clamp unit comprises a diode. The diode comprises an anode and a cathode. The anode is coupled to the gate terminal of the switch device, and the cathode is coupled to the source terminal of the switch device, in which the second voltage is determined by the forward voltage of the diode.

According to another embodiment of the invention, the voltage clamp unit comprises a first zener diode and a second zener diode. The first zener diode comprises a first anode and a first cathode, in which the first cathode is coupled to the gate terminal of the switch device. The second zener diode comprises a second anode and a second cathode, in which the second anode is coupled to the first anode, and the second cathode is coupled to the source terminal of the switch device. The first voltage is determined by the sum of the reverse breakdown voltage of the second zener diode and the forward voltage of the first zener diode. The second voltage is determined by the sum of the reverse breakdown voltage of the first zener diode and the forward voltage of the second zener diode.

According to another embodiment of the invention, the voltage clamp unit comprises a first diode and a second diode. The first diode comprises a first anode and a first cathode, in which the first cathode is coupled to the gate terminal of the switch device and the first anode is coupled to the source terminal of the switch device. The second diode comprises a second anode and a second cathode, in which the second anode is coupled to the gate terminal of the switch device, and the second cathode is coupled to the source terminal of the switch device. The first voltage is determined by a forward voltage of the first diode and the second voltage is determined by a forward voltage of the second diode.

According to another embodiment of the invention, the voltage clamp unit comprises a first diode and a zener diode. The first diode comprises a first anode and a first cathode, in which the first anode is coupled to the gate terminal of the switch device. The zener diode comprises a zener anode and a zener cathode, in which the zener anode is coupled to the source terminal of the switch device, and the zener cathode is coupled to the first cathode. The first voltage is determined by a sum of the low voltage level minus the capacitor voltage stored in the first capacitor, and the capacitor voltage is equal to the high voltage level minus the suns of a reverse breakdown voltage of the zener diode and a forward voltage of the first diode. The second voltage is determined by a sum of a reverse breakdown voltage of the zener node and a forward voltage of the diode.

According to yet another embodiment of the invention, the voltage clamp unit comprises a first diode and a zener diode. The zener diode comprises a zener anode and a zener cathode, in which the zener anode is coupled to the gate terminal of the switch device. The first diode comprises a first anode and a first cathode, in which the first anode is coupled to the source terminal of the switch device, and the first cathode is coupled to the zener cathode. The first voltage is determined by a sum of a reverse breakdown voltage of the zener diode and a forward voltage of the first diode, and the second voltage is equal to the high voltage level.

According to yet another embodiment of the invention, the voltage clamp unit and the switch device are packaged together.

In an embodiment, a waveform conversion circuit for converting a control signal ranging from a high voltage level to a low voltage level of a reference node to a driving signal is provided. The waveform conversion circuit comprises a parallel circuit of a first capacitor and a first resistor and a voltage clamp unit. The parallel circuit receives the control signal to generate the driving signal at a first node. The voltage clamp unit is coupled between the first node and the reference node, in which the voltage clamp unit is configured to clamp the driving signal.

According to an embodiment of the invention, a first voltage is converted from the low voltage level of the control signal and a second voltage is converted from the high voltage level of the control signal, wherein the driving voltage ranges from the second voltage to the first voltage.

According to an embodiment of the invention, the first voltage is not greater than the low voltage level.

According to an embodiment of the invention, the second voltage is not greater than the high voltage level.

According to an embodiment of the invention, the voltage clamp unit comprises a zener diode. The zener diode comprises an anode and a cathode, in which the anode is coupled to the reference node, and the cathode is coupled to the first node. The first voltage is determined by a forward voltage of the zener diode, and the second voltage is determined by a reverse breakdown voltage of the zener diode.

According to another embodiment of the invention, the voltage clamp unit comprises a zener diode. The zener diode comprises an anode and a cathode, in which the anode is coupled to the first node, and the cathode is coupled to reference node. The first voltage is determined by a reverse breakdown voltage of the zener diode, and the second voltage is determined by a forward voltage of the zener diode.

According to another embodiment of the invention, the voltage clamp unit comprises a diode. The diode comprises an anode and a cathode, in which the anode is coupled to the first node, and the cathode is coupled to the reference node, wherein the second voltage is determined by a forward voltage of the diode.

According to another embodiment of the invention, the voltage clamp unit comprises a first zener diode and a second zener diode. The first zener diode comprises a first anode and a first cathode, in which the first cathode is coupled to the first node. The second zener diode comprises a second anode and a second cathode, in which the second anode is coupled to the first anode, and the second cathode is coupled to the reference node. The first voltage is determined by the sum of the reverse breakdown voltage of the second zener diode and the forward voltage of the first zener diode. The second voltage is determined by the sum of the reverse breakdown voltage of the first zener diode and the forward voltage of the second zener diode.

According to another embodiment of the invention, the voltage clamp unit comprises a first diode and a second diode. The first diode comprises a first anode and a first cathode, in which the first cathode is coupled to the first node and the first anode is coupled to the reference node. The second diode comprises a second anode and a second cathode, in which the second anode is coupled to the first anode and the second cathode is coupled to the reference node. The first voltage is determined by a forward voltage of the first diode and the second voltage is determined by a forward voltage of the second diode.

According to another embodiment of the invention, the voltage clamp unit comprises a first diode and a zener diode. The first diode comprises a first anode and a first cathode, in which the first anode is coupled to the first node. The zener diode comprises a zener anode and a zener cathode, in which the zener anode is coupled to the reference node, and the zener cathode is coupled to the first cathode. The first voltage is determined by a sum of the low voltage level minus the capacitor voltage stored in the first capacitor, and the capacitor voltage is equal to the high voltage level minus the sum of a reverse breakdown voltage of the zener diode and a forward voltage of the first diode. The second voltage is determined by a sum of a reverse breakdown voltage of the zener diode and a forward voltage of the diode.

According to yet another embodiment of the invention, the voltage clamp unit comprises a first diode and a zener diode. The zener diode comprises a zener anode and a zener cathode, in which the zener anode is coupled to the first node. The first diode comprises a first anode and a first cathode, in which the first anode is coupled to the reference node, and the first cathode is coupled to the zener cathode. The first voltage is determined by a sum of a reverse breakdown voltage of the zener diode and a forward voltage of the first diode, and the second voltage is equal to the high voltage level.

In an embodiment, a gate-driving circuit for turning a switch device on and off by applying a driving signal to a gate terminal of the switch device is provided. The switch device has the gate terminal, a drain terminal, and a source terminal coupled to a reference node. The gate-driving circuit comprises a controller and a waveform conversion circuit. The controller is supplied by a high voltage level and a low voltage level to generate a control signal ranging from a high voltage level to a low voltage level of the reference node. The waveform conversion circuit receives the control signal to generate the driving signal, in which the waveform conversion circuit comprises a parallel circuit of a first capacitor and a first resistor and a voltage clamp unit. The parallel circuit is coupled between the controller and the gate terminal of the switch device. The voltage clamp unit is coupled between the gate terminal and the source terminal of the switch device and configured to clamp the driving signal.

According to an embodiment of the invention, a first voltage is converted from the low voltage level of the control signal, and a second voltage is converted from the high voltage level of the control signal.

According to an embodiment of the invention, the waveform conversion circuit converts the control signal ranging from the high voltage level to the low voltage level to the driving signal ranging from the second voltage to the first voltage.

According to an embodiment of the invention, the first voltage is not greater than the low voltage level.

According to an embodiment of the invention, the second voltage is not greater than the high voltage level.

According to an embodiment of the invention, the voltage clamp unit comprises a zener diode. The zener diode comprises an anode and a cathode, in which the anode is coupled to the source terminal of the switch device, and the cathode is coupled to the gate terminal of the switch device. The first voltage is determined by a forward voltage of the zener diode, and the second voltage is determined by a reverse breakdown voltage of the zener diode.

According to another embodiment of the invention, the voltage clamp unit comprises a zener diode. The zener diode comprises an anode and a cathode, in which the anode is coupled to the gate terminal of the switch device, and the cathode is coupled to the source terminal of the switch device. The first voltage is determined by a reverse breakdown voltage of the zener diode, and the second voltage is determined by a forward voltage of the zener diode.

According to another embodiment of the invention, the voltage clamp unit comprises a diode. The diode comprises an anode and a cathode. The anode is coupled to the gate terminal of the switch device, and the cathode is coupled to the source terminal of the switch device, in which the second voltage is determined by a forward voltage of the diode.

According to another embodiment of the invention, the voltage clamp unit comprises: a first zener diode and a second zener diode. The first zener diode comprises a first anode and a first cathode, in which the first cathode is coupled to the gate terminal of the switch device. The second zener diode comprises a second anode and a second cathode, in which the second anode is coupled to the first anode, and the second cathode is coupled to the source terminal of the switch device. The first voltage is determined by the sum of the reverse breakdown voltage of the second zener diode and the forward voltage of the first zener diode. The second voltage is determined by the sum of the reverse, breakdown voltage of the first zener diode and the forward voltage of the second zener diode.

According to an embodiment of the invention, the voltage clamp unit comprises a first diode and a second diode. The first diode comprises a first anode and a first cathode, in which the first cathode is coupled to the gate terminal of the switch device and the first anode is coupled to the source terminal of the switch device. The second diode comprises a second anode and a second cathode, in which the second anode is coupled to the gate terminal of the switch device and the second cathode is coupled to the source terminal of the switch device. The first voltage is determined by a forward voltage of the first diode and the second voltage is determined by a forward voltage of the second diode.

According to another embodiment of the invention, the voltage clamp unit comprises a first diode and a zener diode. The first diode comprises a first anode and a first cathode, in which the first anode is coupled to the gate terminal of the switch device. The zener diode comprises a zener anode and a zener cathode, in which the zener anode is coupled to the source terminal of the switch device, and the zener cathode is coupled to the first cathode. The first voltage is determined by a sum of the low voltage level minus the capacitor voltage stored in the first capacitor, and the capacitor voltage is equal to the high voltage level minus the sum of a reverse breakdown voltage of the zener diode and a forward voltage of the first diode. The second voltage is determined by a sum of a reverse breakdown voltage of the zener diode and a forward voltage of the diode.

According to yet another embodiment of the invention, the voltage clamp unit comprises a first diode and a zener diode. The zener diode comprises a zener anode and a zener cathode, in which the zener anode is coupled to the gate terminal of the switch device. The first diode comprises a first anode and a first cathode, in which the first anode is coupled to the source terminal of the switch device, and the first cathode is coupled to the zener cathode. The first voltage is determined by a sum of a reverse breakdown voltage of the zener diode and a forward voltage of the first diode, and the second voltage is equal to the high voltage level.

According to yet another embodiment of the invention, the voltage clamp unit and the switch device are packaged together.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
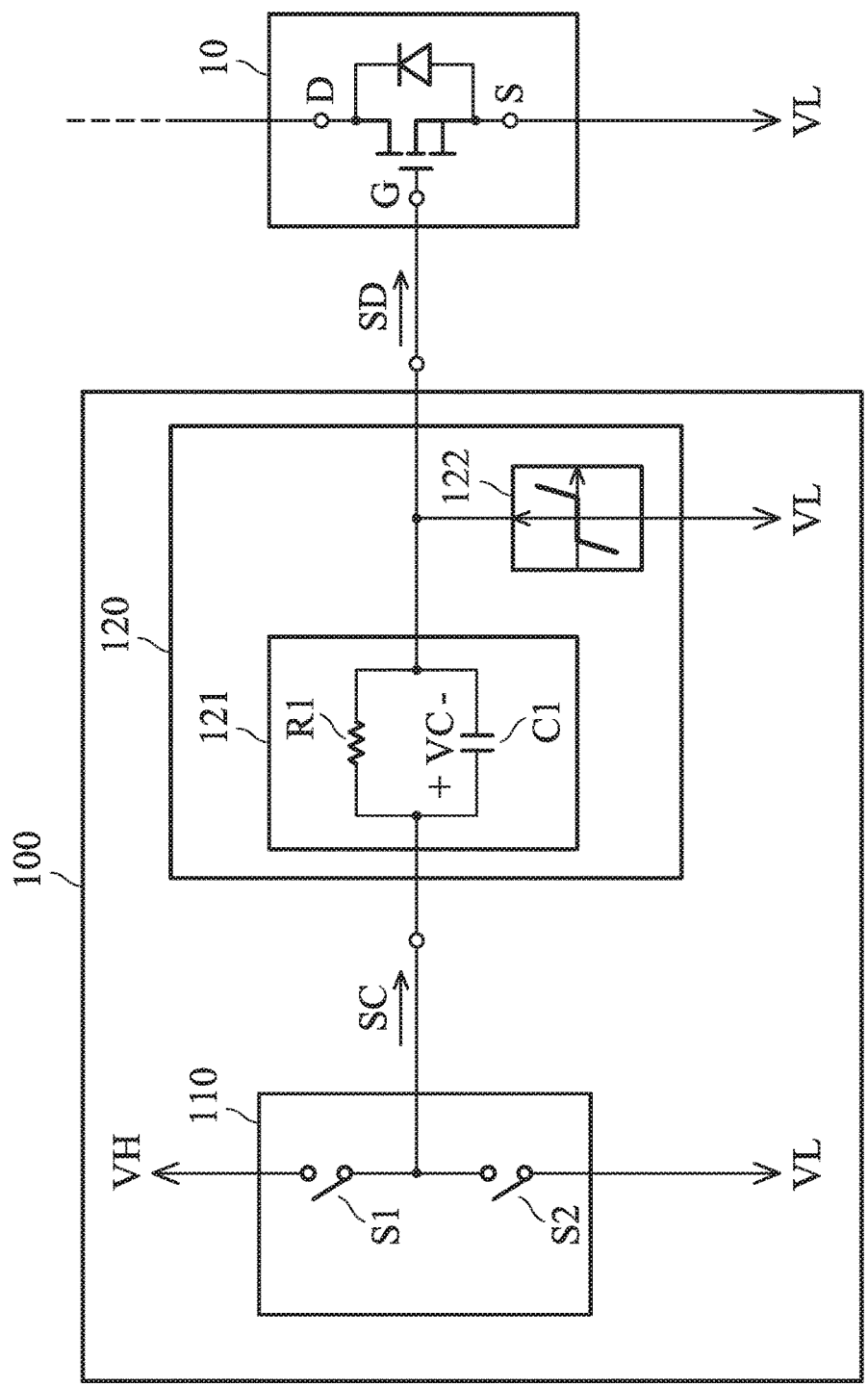
FIG. 1 is a block diagram of a gate driver in accordance with an embodiment of the invention.

FIG. 1 is a block diagram of a gate driver in accordance with an embodiment of the invention. As shown in FIG. 1, the gate driver 100 is configured to turn ON/OFF the switch device 10 which includes the gate terminal G, the source terminal S, and the drain terminal D. According to an embodiment of the invention, the switch device 10 is a normally-off transistor. According to another embodiment of the invention, the switch device is a normally-off GaN FET.

The gate driver 100 includes the controller 110 and the waveform conversion circuit 120. The controller 110, which is supplied by the high voltage level VH and the low voltage level VL, includes the first switch S1 and the second switch S2. The first switch S1 and the second switch S2 are alternately turned on and off, to generate ON/OFF pulses on the control signal SC. The controller 110 is simplified as the first switch S1 and the second switch S2 for the simplicity of explanation.

The ON/OFF pulses of the control signal SC are applied through the parallel circuit 121 including the first resistor R1 and the first capacitor C1 to the gate terminal G of the switch device 10. Since the high voltage level VH exceeds the breakdown voltage of the switch device 10, the voltage clamp unit 122, which is coupled between the gate terminal G and the source of the switch device, is configured to clamp the voltage across the gate terminal G to the source when an ON pulse of the control signal SC is applied to the gate terminal G of the switch device 10. Namely, the voltage clamp unit 122 is configured to clamp the driving signal SD under the breakdown voltage of the switch device 10 when an ON pulse of the control signal SC is applied to the gate terminal G of the switch device 10, since the voltage clamp unit 122 and the source of the switch device 10 are both coupled to the low voltage level VL.

When an OFF pulse of the control signal SC is applied to the gate terminal G of the switch device 10 through the parallel circuit 121, the voltage clamp unit 122 is configured to clamp the capacitor voltage VC stored in the first capacitor C1. According to an embodiment of the invention, the low voltage level VL is equal to the ground level, such that the driving signal SD is equal to the minus capacitor voltage VC. According to an embodiment of the invention, a normally-off GaN FET needs a negative bias to be turned off. The first capacitor C1 integrated with the voltage clamp unit 122 could properly turn off the switch device 10 when the switch device 10 is a normally-off GaN FET.

Figure 2:
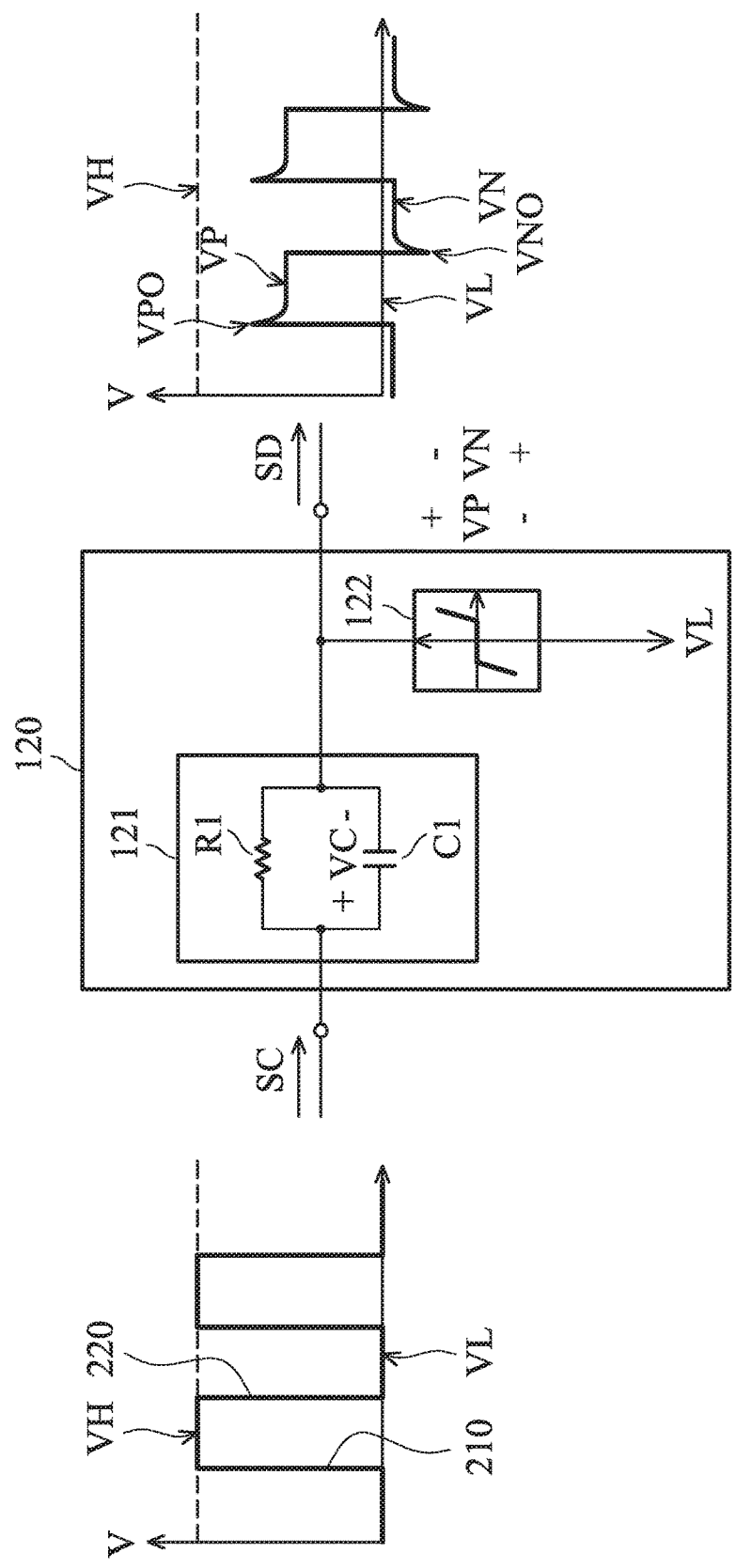
FIG. 2 shows the function of the waveform conversion circuit 120 in accordance with an embodiment of the invention.

FIG. 2 shows the function of the waveform conversion circuit 120 in accordance with an embodiment of the invention. As shown in FIG. 2, the control signal SC is illustrated as a square wave herein, which ranges from the high voltage level VH to the low voltage level VL.

When the waveform conversion circuit 120 receives an ON pulse 210 of the control signal SC, the voltage clamp unit 122 clamps the driving signal SD at the second voltage VP of the voltage clamp unit 122. The first resistor R1 is configured to clamp the current flowing from the control signal SC to the low voltage level VL through the voltage clamp unit 122.

The overshoot voltage VPO can be determined by the first capacitor C1 and the parasitic resistance along the path from the control signal SC to the voltage clamp unit 122 through the first capacitor C1. According to an embodiment of the invention, the overshoot voltage VPO is as much as the high voltage level VH. According to an embodiment of the invention, the overshoot voltage VPO of the driving signal SD is configured to turn ON the switch device 10 in a faster speed, and the driving signal SD is then clamped at the second voltage VP to keep the conduction loss of the switch device 10 reasonably low.

When the waveform conversion circuit 120 receives an OFF pulse 220 of the control signal SC, the low voltage level VL is applied to a terminal of the first capacitor C1. Since the capacitor voltage VC has been stored in the first capacitor C1 when the control signal SC is in the high voltage level VH, the driving signal SD is a negative voltage when the low voltage level VL is applied to the first capacitor C1. In addition, the driving signal SD is then clamped at the first voltage VN of the voltage clamp unit 122.

Likewise, the undershoot voltage VNO is also determined by the first capacitor C1 and the parasitic resistance along the path from the control signal SC to the voltage clamp unit 122 through the first capacitor C1. According to an embodiment of the invention, the undershoot voltage VNO of the driving signal SD is configured to turn OFF the switch device 10 in a faster speed, and the driving signal SD is then clamped at the first voltage VN to keep the leakage loss of the switch device 10 reasonably low. According to an embodiment of the invention, the first voltage VN, which is less than the low voltage level VL, is configured to prevent the switch device 10 to be turned ON by noise coupling.

According to an implemented embodiment of the invention, the high voltage level VH is 12V, the low voltage level VL is 0V, the threshold voltage of the switch device 10 is 1V, and the range of the gate-to-source voltage of the switch device 10 is −5V~7V, Therefore, the second voltage VP is clamped around 6V to keep the turn-on resistance of the switch device 10 reasonably low, and the first voltage VN is clamped at −1 V to ensure that the switch device 10 is fully turned off.

Figure 3:
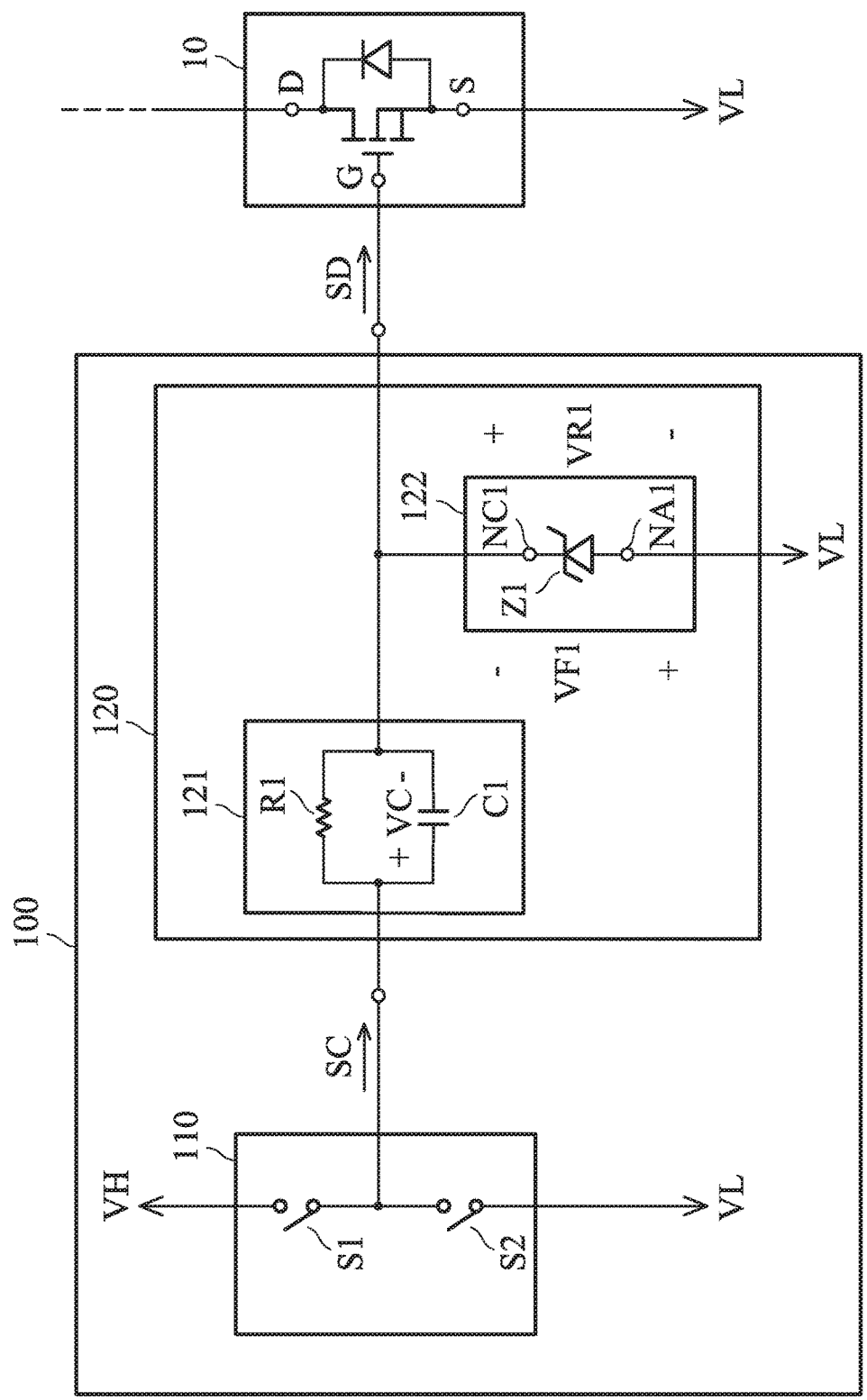
FIG. 3 is a block diagram of a gate driver in accordance with another embodiment of the invention.

FIG. 3 is a block diagram of a gate driver in accordance with another embodiment of the invention. As shown in FIG. 3, the voltage clamp unit 122 includes the first zener diode Z1. The first zener diode Z1 includes the first anode NA1 and the second cathode NC1. When a current flows through the first zener diode Z1 from the first anode NA1 to the first cathode NC1, the voltage across the first zener diode Z1 is defined as the first forward voltage VF1. According to an embodiment of the invention, when a current flows through the first zener diode Z1 from the first cathode NC1 to the first anode NA1, the voltage across the first zener diode Z1 is defined as the first reverse breakdown voltage VR1.

According to an embodiment of the invention, when the waveform conversion circuit 120 receives the control signal SC in the high voltage level VH, the driving signal SD is eventually clamped at the first reverse breakdown voltage VR1 of the first zener diode Z1. According to another embodiment of the invention, when the waveform conversion circuit 120 receives the control signal SC in the low voltage level VL, the driving signal SD is then clamped at the low voltage level VL minus the first forward voltage VF1 of the first zener diode Z1.

According to an embodiment of the invention, the first forward voltage VF1 is 0.7 V, the first reverse breakdown voltage VR1 is 6 V, the high voltage level VH is 12 V, and the low voltage level VL is 0 V. The driving signal SD is clamped at 6V when the control signal SC is 12 V, and the driving signal SD is equal to −0.7V when the control signal SC is 0 V. Therefore, when the switch device 10 is illustrated as a normally-off GaN FET, the turn-on resistance of the switch device 10 could be kept low due to the 6V driving signal SD, and the switch device 10 could be fully turned off due to the −0.7V driving signal SD.

Figure 4:
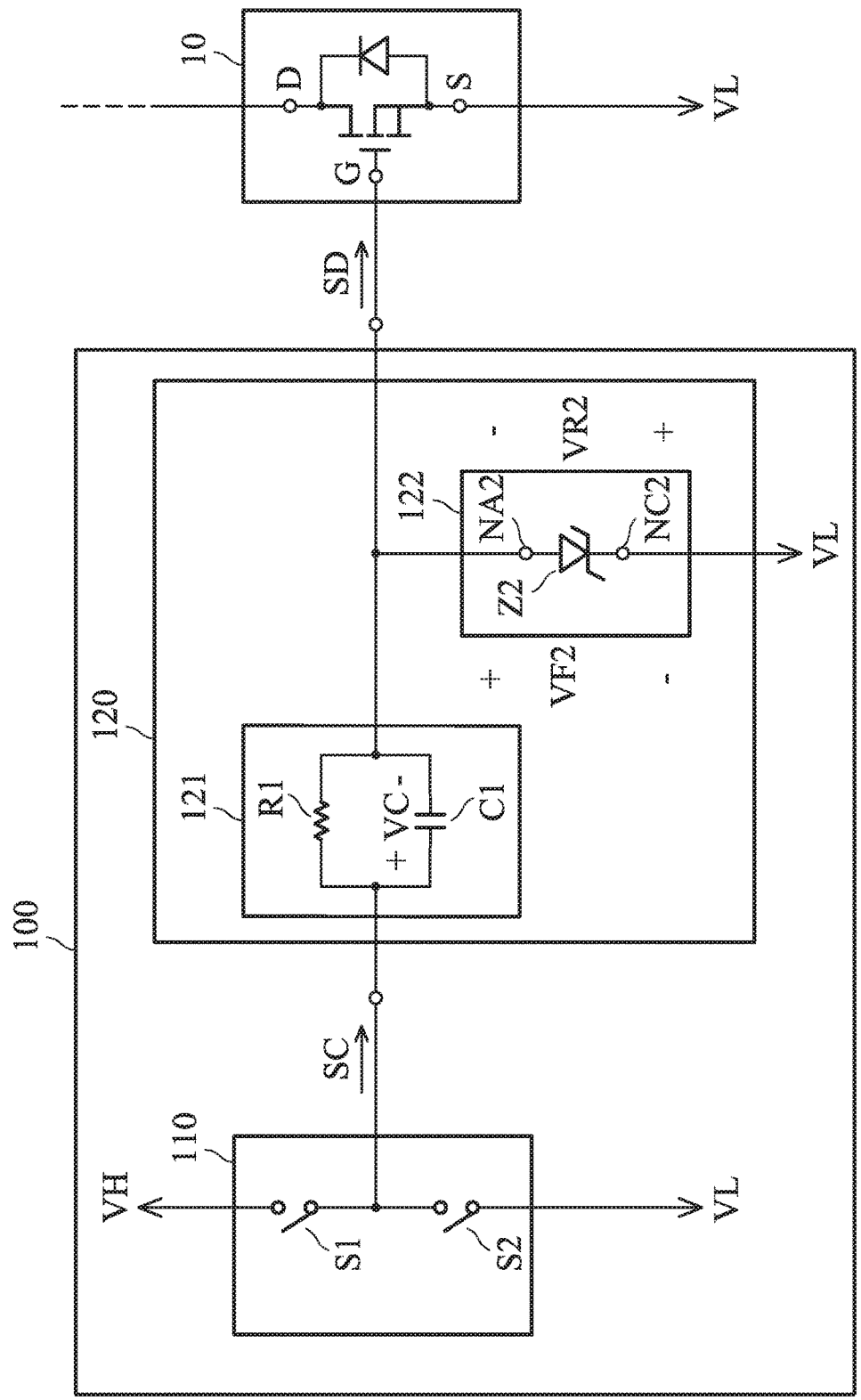
FIG. 4 is a block diagram of a gate driver in accordance with yet another embodiment of the invention.

FIG. 4 is a block diagram of a gate driver in accordance with yet another embodiment of the invention. Comparing the voltage clamp unit 122 in FIG. 4 with that in FIG. 3, the second anode NA2 of the second zener diode Z2 is coupled to the parallel circuit 121 and the low voltage level VL is applied to the second cathode NC2 of the second zener diode Z2. According to an embodiment of the invention, when the waveform conversion circuit 120 receives the control signal SC in the high voltage level VH, the driving signal SD is determined by the second forward voltage VF2 of the second zener diode Z2. According to another embodiment of the invention, when the waveform conversion circuit 120 receives the control signal SC in the low voltage level VL, the driving signal SD is then eventually clamped at the low voltage level VL minus the second reverse breakdown voltage VR2 of the second zener diode Z2.

Figure 5:
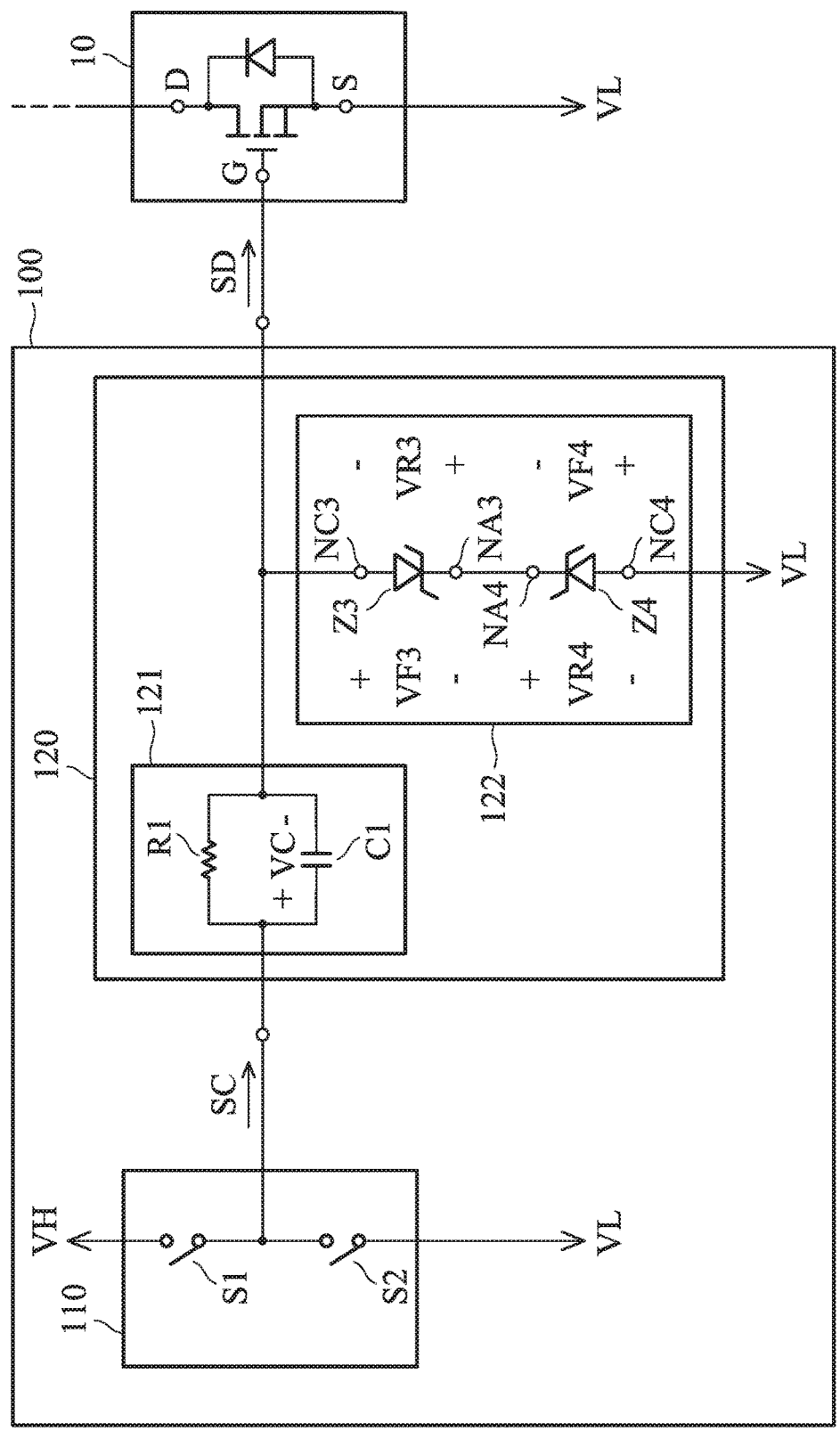
FIG. 5 is a block diagram of a gate driver in accordance with yet another embodiment of the invention.

FIG. 5 is a block diagram of a gate driver in accordance with yet another embodiment of the invention. As shown in FIG. 5, the voltage clamp unit 122 includes the third zener diode Z3 and the fourth zener diode Z4. The third anode NA3 of the third zener diode Z3 is coupled to the fourth anode NA4 of the fourth zener diode Z4. The third cathode NC3 is coupled to the gate terminal G of the switch device 10, and the fourth cathode NC4 is coupled to the source of the switch device 10.

According to an embodiment of the invention, when the waveform conversion circuit 120 receives the control signal SC in the high voltage level VH, the driving signal SD is clamped at the sum of the third forward voltage VF3 of the third zener diode Z3 and the fourth reverse breakdown voltage VR4 of the fourth zener diode Z4. According to another embodiment of the invention, when the waveform conversion circuit 120 receives the control signal SC in the low voltage level VL, the driving signal SD is then clamped at the low voltage level VL minus the sum of the third reverse breakdown voltage VR3 of the third zener diode Z3 and the fourth forward voltage VF4 of the fourth zener diode Z4.

Figure 6:
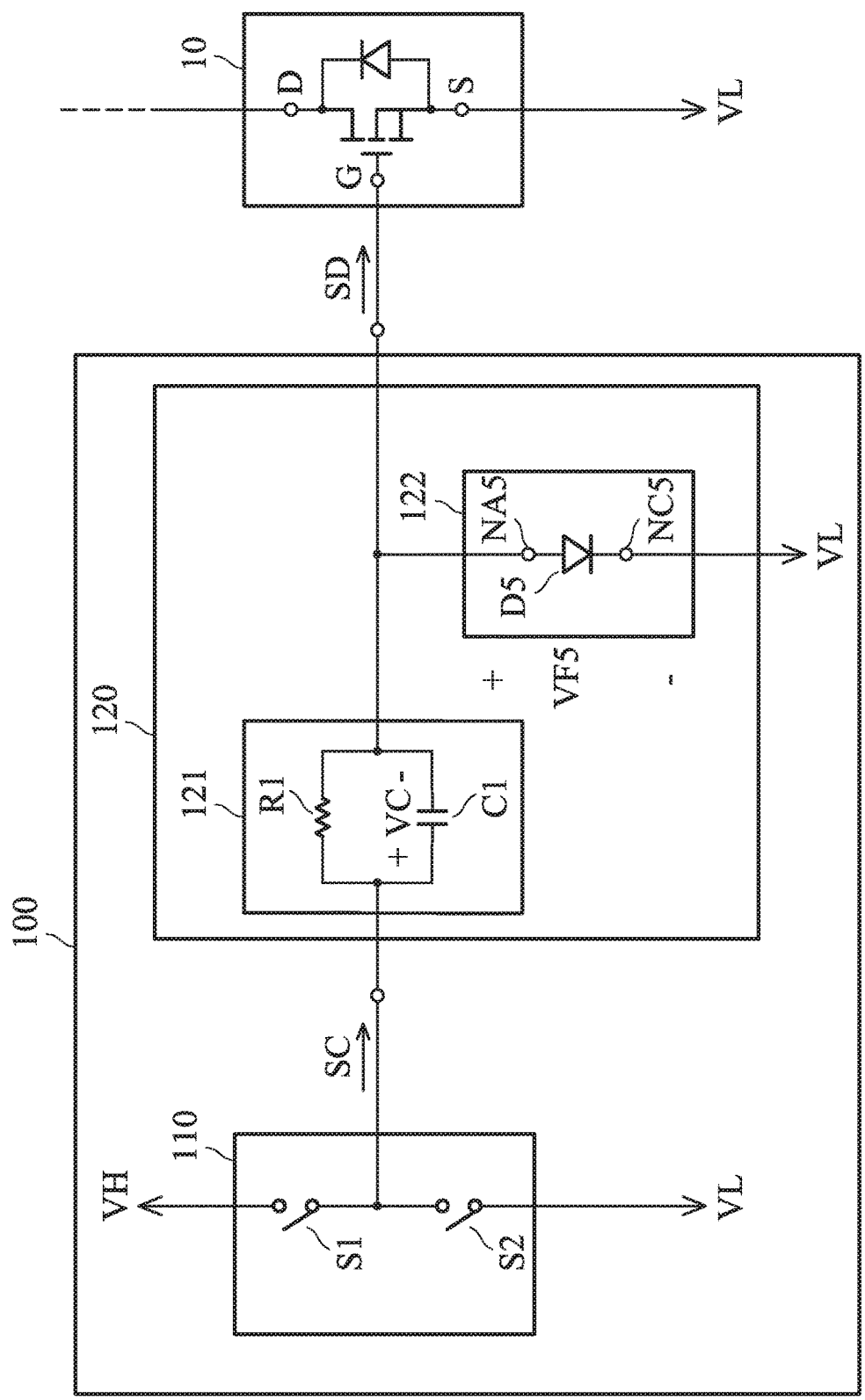
FIG. 6 is a block diagram of a gate driver in accordance with yet another embodiment of the invention.

FIG. 6 is a block diagram of a gate driver in accordance with yet another embodiment of the invention. As shown in FIG. 6, the voltage clamp unit 122 includes the fifth diode D5 which has the fifth forward voltage VF5. According to an embodiment of the invention, when the waveform conversion circuit 120 receives the control signal SC in the high voltage level VH, the driving signal SD is determined by the fifth forward voltage VF5 of the fifth diode Z5.

According to another embodiment of the invention, when the waveform conversion circuit 120 receives the control signal SC in the low voltage level VL, the driving signal SD is equal to the capacitor voltage VC stored in the first capacitor C1, since the fifth diode D5 is open during reverse biasing. In addition, the capacitor voltage VC is equal to the high voltage level VH minus the fifth forward voltage VF5.

Figure 7:
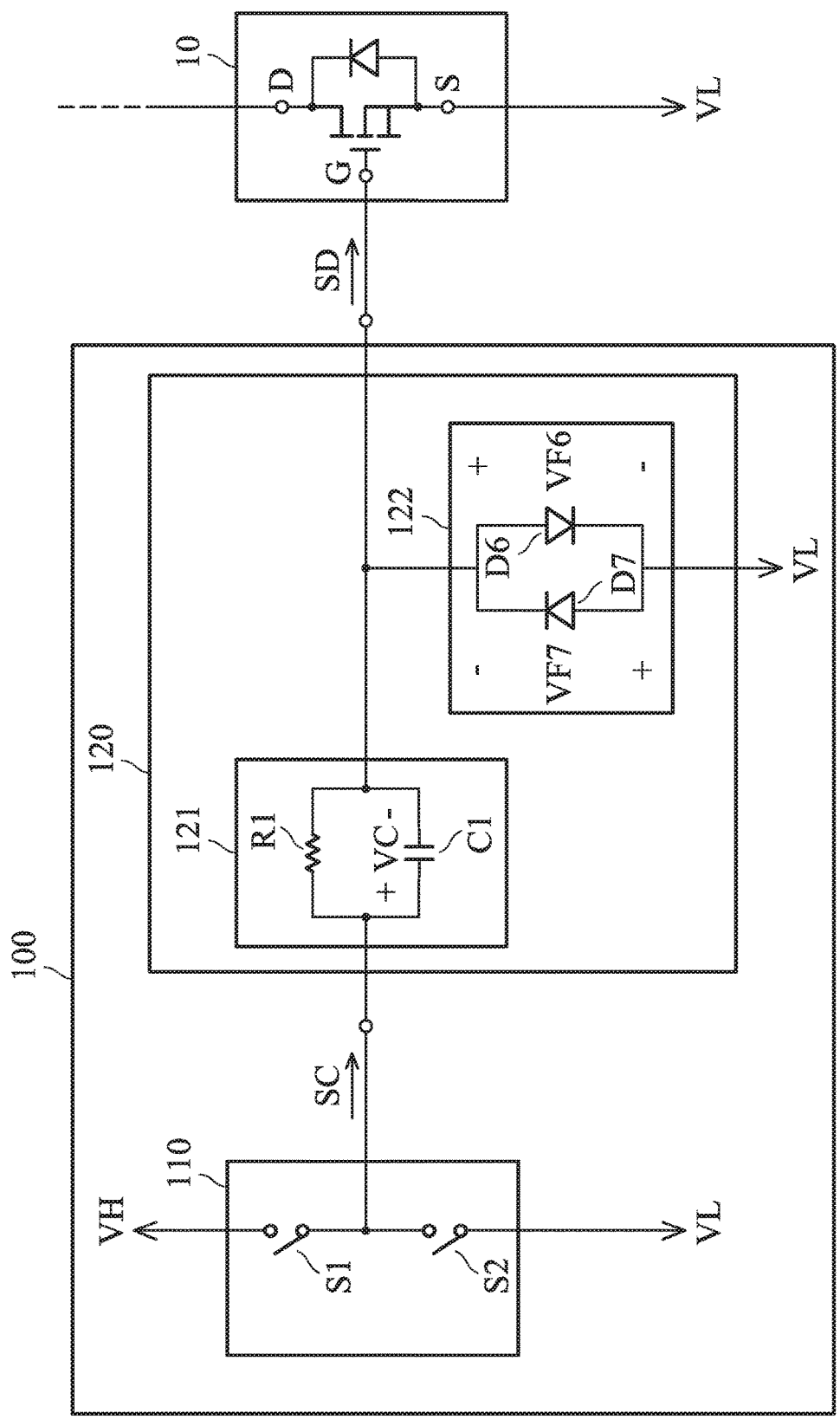
FIG. 7 is a block diagram of a gate driver in accordance with yet another embodiment of the invention.

FIG. 7 is a block diagram of a gate driver in accordance with yet another embodiment of the invention. As shown in FIG. 7, the voltage clamp unit 122 includes the sixth diode D6, which has the sixth forward voltage VF6, and the seventh diode D7, which has the seventh forward voltage VF7.

According to an embodiment of the invention, when the waveform conversion circuit 120 receives the control signal SC in the high voltage level VH, the driving signal SD is determined by the sixth forward voltage VF6 of the sixth diode Z6. According to another embodiment of the invention, when the waveform conversion circuit 120 receives the control signal SC in the low voltage level VL, the driving signal SD is clamped at the low voltage level VL minus the seventh forward voltage VF7.

Figure 8:
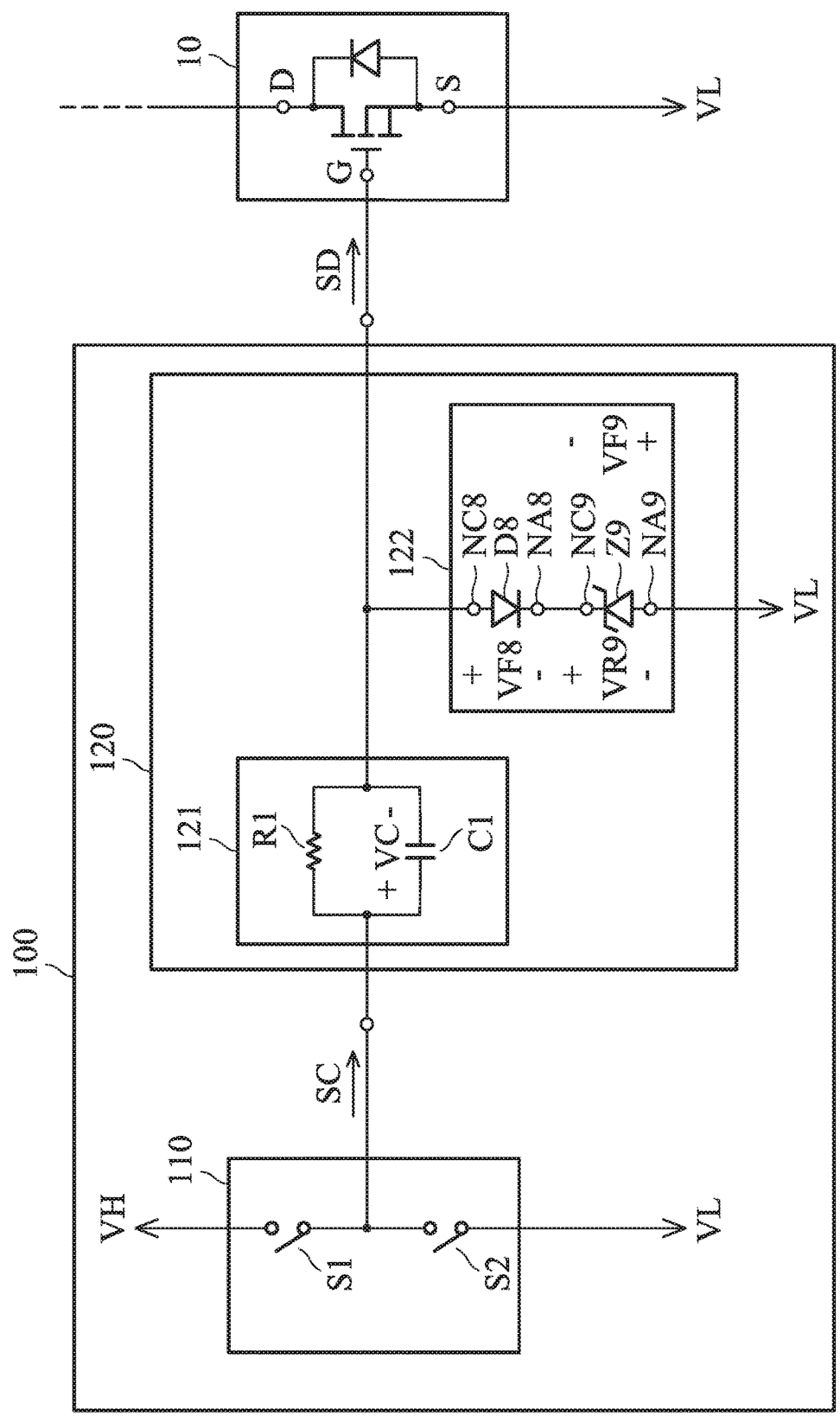
FIG. 8 is a block diagram of a gate driver in accordance with yet another embodiment of the invention.

FIG. 8 is a block diagram of a gate driver in accordance with yet another embodiment of the invention. As shown in FIG. 8, the voltage clamp unit 122 includes the eighth diode D8, which has the eighth forward voltage VF8, and the ninth zener diode Z9, which has the ninth forward voltage VF9 and the ninth reverse breakdown voltage VR9. The eighth anode NA8 of the eighth diode D8 is coupled to the ninth cathode NC9 of the ninth zener diode Z9. The eighth cathode NC8 is coupled to the gate terminal G of the switch device 10, and the ninth anode NA9 is coupled to the source of the switch device 10.

According to an embodiment of the invention, when the waveform conversion circuit 120 receives the control signal SC in the high voltage level VH, the driving signal SD is clamped at a clamped voltage equal to the sum of the eighth forward voltage VF8 of the eighth diode D8 and the ninth reverse breakdown voltage VR9 of the ninth zener diode Z9. Therefore, the capacitor voltage VC stored in the first capacitor C1 is equal to the high voltage level VH minus the clamped voltage. According to another embodiment of the invention, when the waveform conversion circuit 120 receives the control signal SC in the low voltage level VL, the driving signal SD is equal to the low voltage level VL minus the capacitor voltage VC, since the eighth diode D8 is open during reverse biasing.

Figure 9:
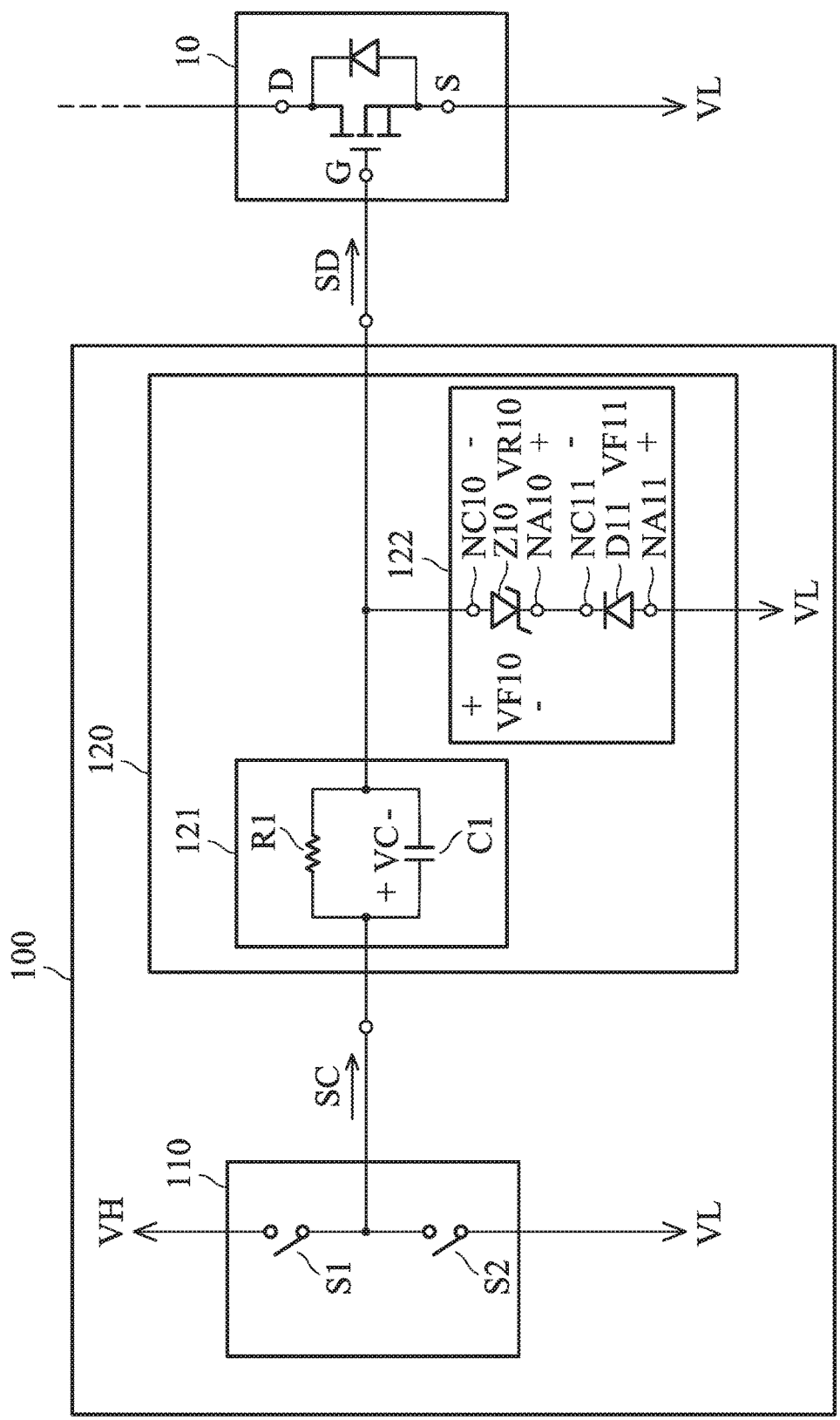
FIG. 9 is a block diagram of a gate driver in accordance with yet another embodiment of the invention.

FIG. 9 is a block diagram of a gate driver in accordance with yet another embodiment of the invention. As shown in FIG. 9, the voltage clamp unit 122 includes the tenth zener diode Z10 and the eleventh diode D11. The tenth anode NA10 of the tenth zener diode Z10 is coupled to the eleventh cathode NC11 of the eleventh diode D11. The tenth cathode NC10 is coupled to the gate terminal G of the switch device 10, and the eleventh anode NA11 is coupled to the source of the switch device 10.

According to an embodiment of the invention, when the waveform conversion circuit 120 receives the control signal SC in the high voltage level VH, the driving signal SD is equal to the high voltage level VH, since the eleventh diode D11 is open during forward biasing. According to another embodiment of the invention, when the waveform conversion circuit 120 receives the control signal SC in the low voltage level VL, the driving signal SD is then clamped at the low voltage level VL minus the sum of the tenth reverse breakdown voltage VR10 of the tenth zener diode Z10 and the eleventh forward voltage VF11 of the eleventh diode D11.

Figure 10:
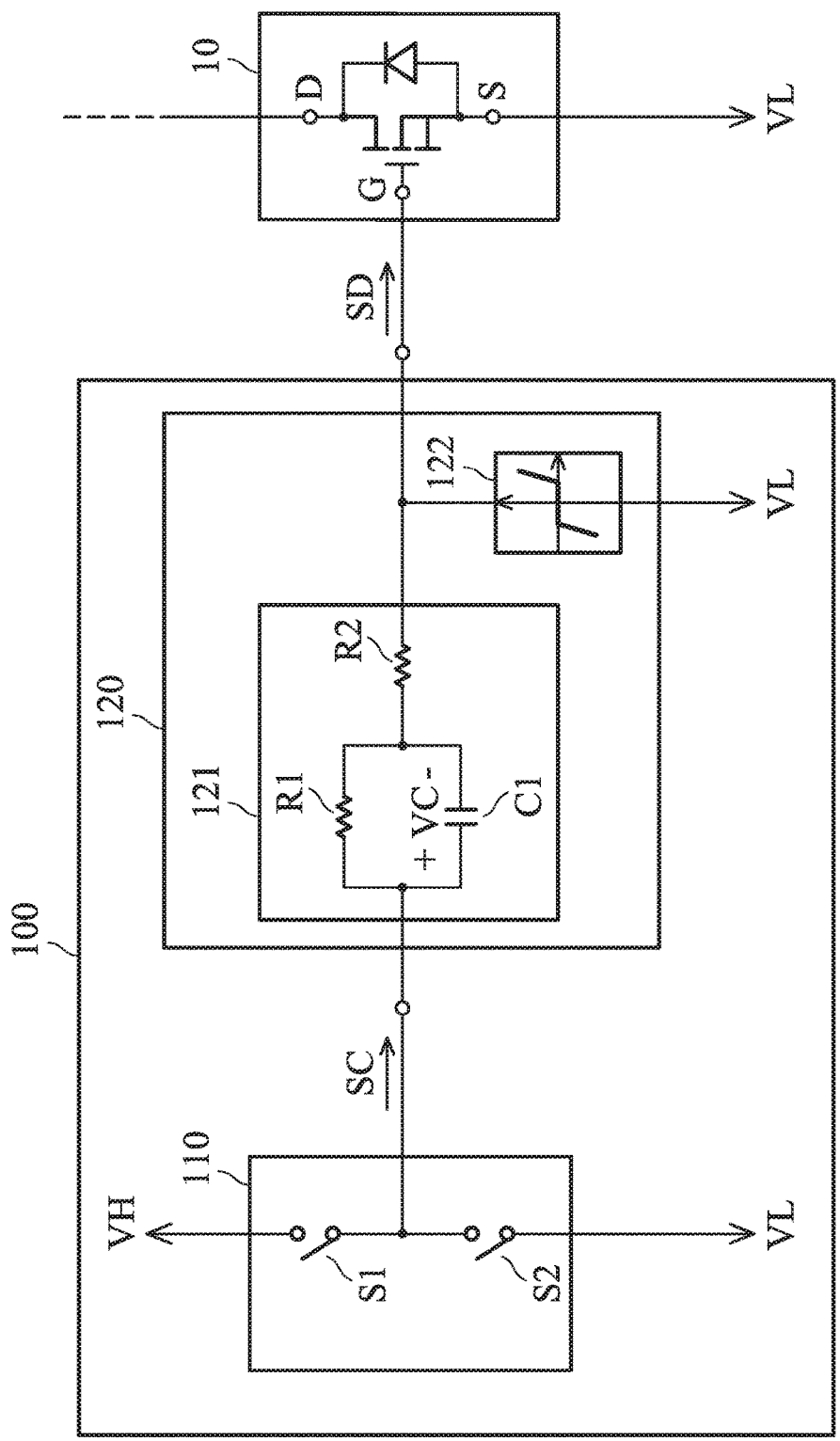
FIG. 10 is a block diagram of a gate driver in accordance with yet another embodiment of the invention.

FIG. 10 is a block diagram of a gate driver in accordance with yet another embodiment of the invention. As shown in FIG. 8, the parallel circuit 121 the parallel circuit 121 includes the first resistor R1, the second resistor R2, and the first capacitor C1, in which the second resistor R2 is coupled to the paralleled pair of the first resister R1 and the first capacitor C1 in series.

When the waveform conversion circuit 120 receives the control signal SC in the high voltage level VH, the total resistance of the first resistor R1 and the second resistor R2 is configured to clamp a current flowing from the high voltage level VH to the low voltage level VL through the voltage clamp unit 122. In addition, the second resistor R2 and the first capacitor C1 are configured to determine the overshoot voltage VPO and the undershoot voltage VNO.

Figure 11:
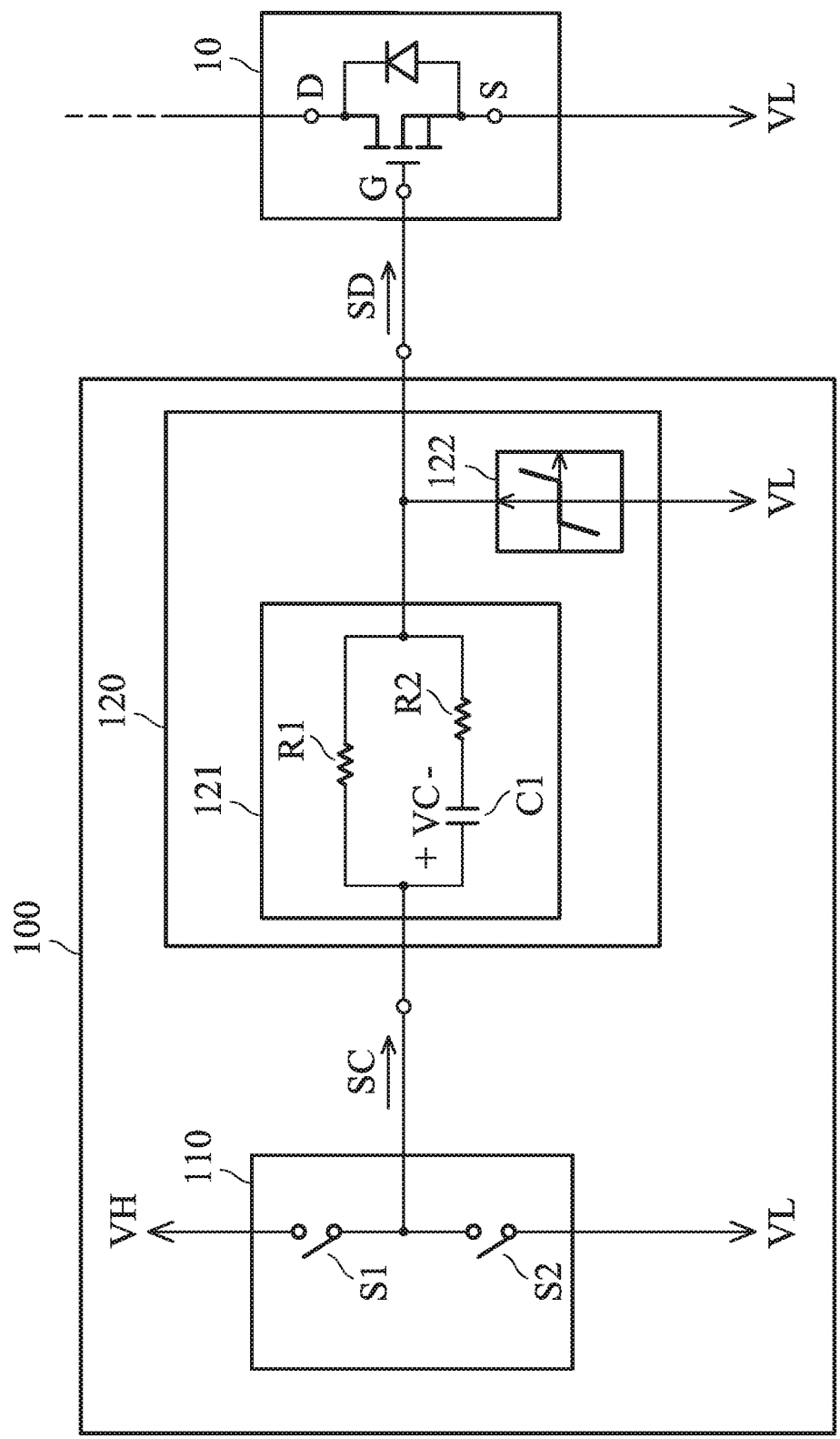
FIG. 11 is a block diagram of a gate driver in accordance with yet another embodiment of the invention.

FIG. 11 is a block diagram of a gate driver in accordance with yet another embodiment of the invention. As shown in FIG. 9, the parallel circuit 121 includes the first resistor R1, the second resistor R2, and the first capacitor C1, in which the series pair of the second resistor R2 and the first capacitor C1 is coupled to the first resistor R1 in parallel.

When the waveform conversion circuit 120 receives the control signal SC in the high voltage level VH, the resistance of the first resistor R1 is configured to clamp a current flowing from the high voltage level VH to the low voltage level VL through the voltage clamp unit 122. In addition, the second resistor R2 and the first capacitor C1 are configured to determine the overshoot voltage VPO and the undershoot voltage VNO.

Figure 12:
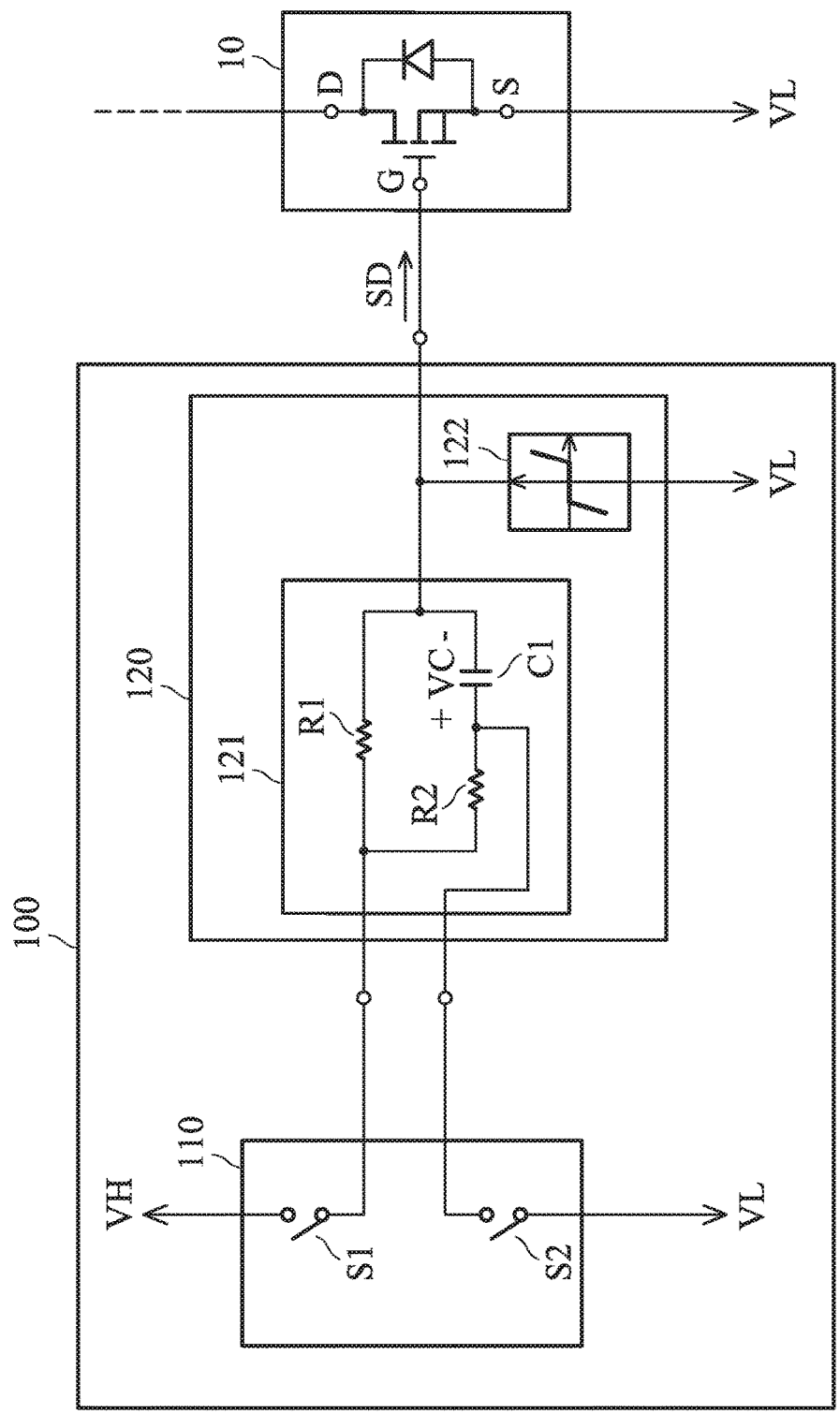
FIG. 12 is a block diagram of a gate driver in accordance with yet another embodiment of the invention.

FIG. 12 is a block diagram of a gate driver in accordance with yet another embodiment of the invention. As shown in FIG. 10, the parallel circuit 121 includes the first resistor R1, the second resistor R2, and the first capacitor C1, in which the series pair of the second resistor R2 and the first capacitor C1 is coupled to the first resistor R1 in parallel. The first switch S1 of the controller 110 is coupled to an end of the parallel circuit 121, and the second switch S2 is coupled to the middle of the series pair of the second resistor R2 and the first capacitor C1.

When the waveform conversion circuit 120 receives the control signal SC in the high voltage level VH, the resistance of the first resistor R1 is configured to clamp a current flowing from the high voltage level VH to the low voltage level VL through the voltage clamp unit 122. In addition, the overshoot voltage VPO is determined by the second resistor R2 and the first capacitor C1, while the undershoot voltage VNO is determined by the first capacitor C1 and the parasitic resistance along the path from the second switch S2 to the voltage clamp unit 122.

Figure 13:
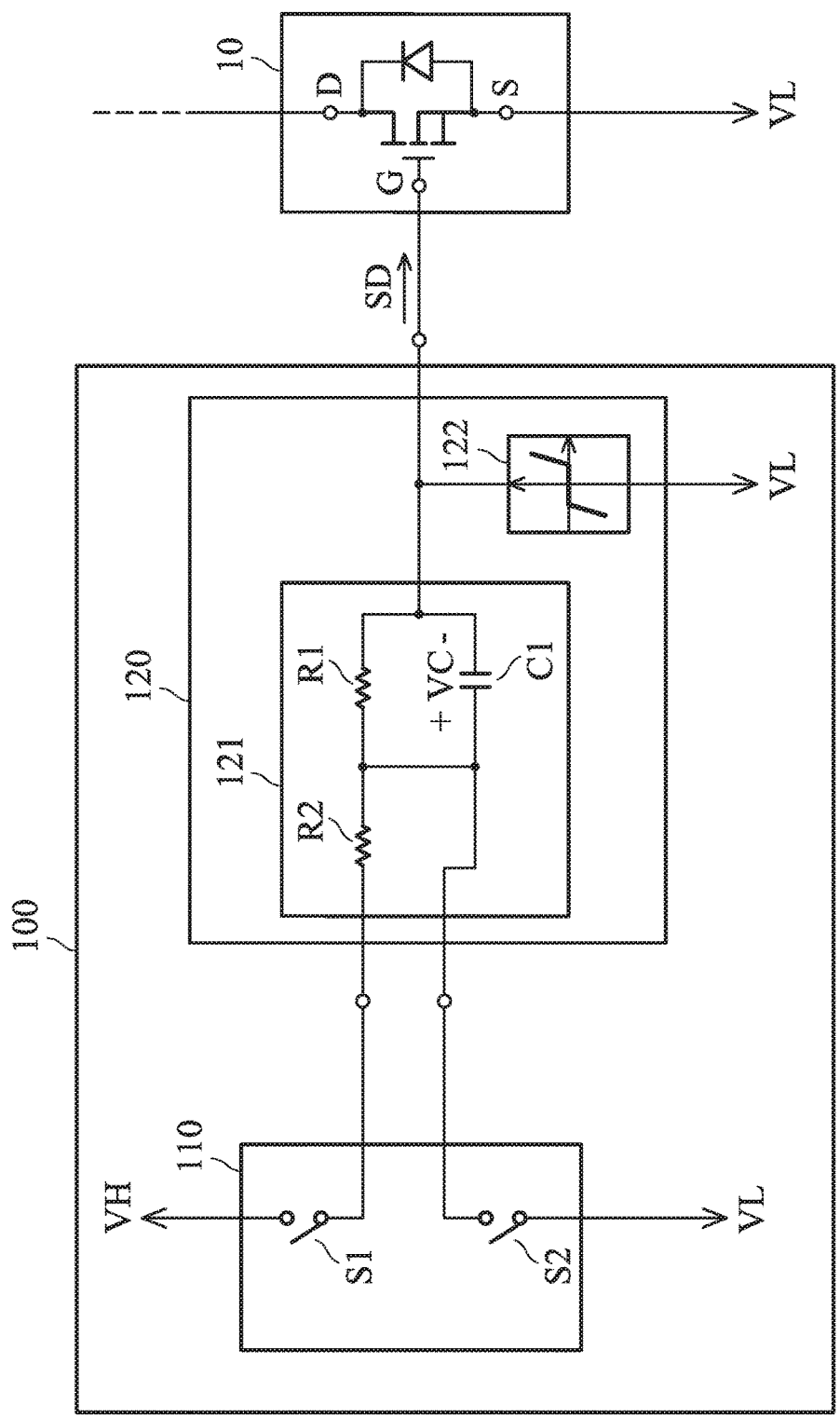
FIG. 13 is a block diagram of a gate driver in accordance with yet another embodiment of the invention.

FIG. 13 is a block diagram of a gate driver in accordance with yet another embodiment of the invention. As shown in FIG. 13, the parallel circuit 121 includes the first resistor R1, the second resistor R2, and the first capacitor C1, in which the second resistor R2 is coupled to the paralleled pair of the first resistor R1 and the first capacitor C1 in series. The first switch S1 of the controller 110 is coupled to the second resistor R2, and the second switch S2 is coupled to the middle of the second resistor R2 and the paralleled pair of the first resistor R1 and the first capacitor C1.

When the waveform conversion circuit 120 receives the control signal SC in the high voltage level VH, the total resistance of the first resistor R1 and the second resistor R2 is configured to clamp a current flowing from the high voltage level VH to the low voltage level VL through the voltage clamp unit 122. In addition, the overshoot voltage VPO is determined by the second resistor R2 and the first capacitor C1, while the undershoot voltage VNO is determined by the first capacitor C1 and the parasitic resistance along the path from the second switch S2 to the voltage clamp unit 122.

Figure 14:
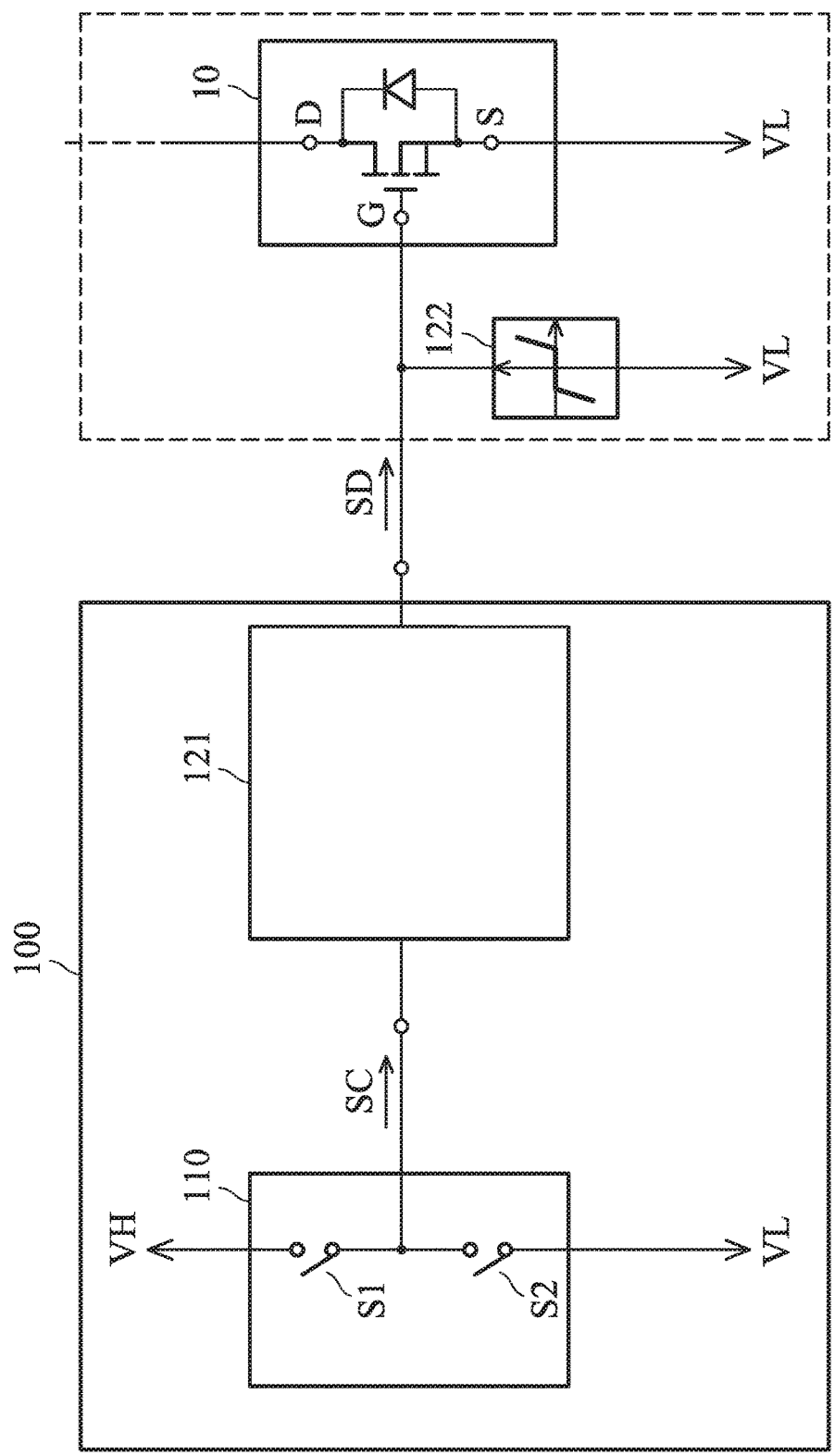
FIG. 14 is a block diagram of a gate driver in accordance with yet another embodiment of the invention.

FIG. 14 is a block diagram of a gate driver in accordance with yet another embodiment of the invention. As shown in FIG. 14, the voltage clamp unit 122 and the switch device 10 are packaged together, such that the gate driver 100 only includes the controller 110 and the parallel circuit 121.

As illustrated in FIGS. 3-14, several embodiments of the waveform conversion circuit have been described in detail. A controller, which was designed to drive a Si MOSFET, is able to drive a normally-off GaN FET by inserting the waveform conversion circuit illustrated in FIGS. 3-14 between the controller and the switch device without modifying the controller, even though the breakdown voltage of a normally-off GaN FET is less than that of a Si MOSFET.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A waveform conversion circuit for turning on and off a switch device having the gate terminal, a drain terminal, and a source terminal coupled to a low voltage level according to a controller, wherein the controller comprises a first switch supplying a high voltage level to a first node and a second switch coupling a second node to the low voltage level, wherein the first switch and the second switch are alternatively turned on and off, the waveform conversion circuit comprising:
   a first resistor, coupled between the first node and the gate terminal;
   a second resistor, coupled between the first node and the second node;
   a first capacitor, coupled between the second node and the gate terminal; and
   a voltage clamp unit, coupled between the gate terminal and the source terminal of the switch device and configured to clamp a voltage across the gate terminal to the source terminal.

2. The waveform conversion circuit of claim 1, wherein the second resistor and the first capacitor are configured to determine an overshoot voltage in response to first switch being on, wherein the overshoot voltage is configured to turn on the switch device at high speed.

3. The waveform conversion circuit of claim 1, wherein first capacitor and parasitic resistance of the second switch are configured to determine an undershoot voltage in response to second switch being on, wherein the undershoot voltage is configured to turn off the switch device at high speed.

4. The waveform conversion circuit of claim 1, wherein the voltage clamp unit is configured to clamp the voltage across the gate terminal to the source terminal at a first voltage in response to the second switch being on.

5. The waveform conversion circuit of claim 4, wherein the first voltage is less than the low voltage level.

6. The waveform conversion circuit of claim 4, wherein the voltage clamp unit is configured to clamp the voltage across the gate terminal to the source terminal at a second voltage in response to the first switch being on.

7. The waveform conversion circuit of claim 6, wherein the second voltage is not greater than the high voltage level.

8. The waveform conversion circuit of claim 6, wherein the voltage clamp unit comprises:

a zener diode, comprising an anode and a cathode, wherein the anode is coupled to the source terminal of the switch device, and the cathode is coupled to the gate terminal of the switch device, wherein the first voltage is determined by a forward voltage of the zener diode, and the second voltage is determined by a reverse breakdown voltage of the zener diode.

9. The waveform conversion circuit of claim 1, wherein the voltage clamp unit and the switch device are packaged together.

10. The waveform conversion circuit of claim 1, wherein the waveform conversion circuit and the switch device are packaged together.

11. A gate-driving circuit for turning on and off a switch device having the gate terminal, a drain terminal, and a source terminal coupled to a reference node, the gate-driving circuit comprising:
 a controller, comprising:
  a first switch, supplying a high voltage level to a first node; and
  a second switch, coupling a second node to a low voltage level of the reference node; and
 a waveform conversion circuit, comprising:
  first resistor, coupled between the first node and the gate terminal,
  a second resistor, coupled between the first node and the second node,
  a first capacitor, coupled between the second node and the gate terminal; and
  a voltage clamp unit, coupled between the gate terminal and the source terminal of the switch device and configured to clamp the driving signal.

12. The gate-driving circuit of claim 11, wherein the second resistor and the first capacitor are configured to determine an overshoot voltage in response to first switch being on, wherein the overshoot voltage is configured to turn on the switch device at high speed.

13. The gate-driving circuit of claim 11, wherein first capacitor and parasitic resistance of the second switch are configured to determine an undershoot voltage in response to second switch being on, wherein the undershoot voltage is configured to turn off the switch device at high speed.

14. The gate-driving circuit of claim 11, wherein the voltage clamp unit is configured to clamp the voltage across the gate terminal to the source terminal at a first voltage in response to the second switch being on.

15. The gate-driving circuit of claim 14, wherein the first voltage is less than the low voltage level.

16. The gate-driving circuit of claim 14, wherein the voltage clamp unit is configured to clamp the voltage across the gate terminal to the source terminal at a second voltage in response to the first switch being on.

17. The gate-driving circuit of claim 16, wherein the second voltage is not greater than the high voltage level.

18. The gate-driving circuit of claim 16, wherein the voltage clamp unit comprises:
 a zener diode, comprising an anode and a cathode, wherein the anode is coupled to the source terminal of the switch device, and the cathode is coupled to the gate terminal of the switch device, wherein the first voltage is determined by a forward voltage of the zener diode, and the second voltage is determined by a reverse breakdown voltage of the zener diode.

19. The gate-driving circuit of claim 11, wherein the voltage clamp unit and the switch device are packaged together.

20. The gate-driving circuit of claim 11, wherein waveform conversion circuit and the controller are packaged together.

* * * * *